(12) United States Patent
Seta

(10) Patent No.: US 9,191,637 B2
(45) Date of Patent: Nov. 17, 2015

(54) SOLID-STATE IMAGING APPARATUS

(71) Applicant: Kabushiki Kaisha Toshiba, Minato-Ku, Tokyo (JP)

(72) Inventor: Shoji Seta, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 87 days.

(21) Appl. No.: 14/185,595

(22) Filed: Feb. 20, 2014

(65) Prior Publication Data
US 2015/0070538 A1 Mar. 12, 2015

Related U.S. Application Data

(60) Provisional application No. 61/876,178, filed on Sep. 10, 2013.

(51) Int. Cl.
*H04N 5/335* (2011.01)
*H04N 9/04* (2006.01)
*H01L 27/146* (2006.01)

(52) U.S. Cl.
CPC ............ *H04N 9/045* (2013.01); *H01L 27/1463* (2013.01); *H01L 27/1464* (2013.01); *H01L 27/14601* (2013.01); *H01L 27/14609* (2013.01); *H01L 27/14621* (2013.01); *H01L 27/14627* (2013.01)

(58) Field of Classification Search
CPC ............. H04N 9/045; H01L 27/14609; H01L 27/14627; H01L 27/14621; H01L 27/14601; H01L 27/1463; H01L 27/1464; G02F 1/134363; G02F 2001/136218; G09G 2320/0209
See application file for complete search history.

(56) References Cited

U.S. PATENT DOCUMENTS

| | | | |
|---|---|---|---|
| 2006/0104564 A1* | 5/2006 | Catrysse et al. | 385/14 |
| 2008/0042230 A1* | 2/2008 | Miida | 257/458 |
| 2009/0026508 A1* | 1/2009 | Seitz | 257/292 |
| 2010/0059843 A1* | 3/2010 | Ikuta et al. | 257/432 |
| 2011/0310282 A1 | 12/2011 | Toda et al. | |
| 2014/0117486 A1* | 5/2014 | Doi et al. | 257/448 |
| 2015/0130003 A1* | 5/2015 | Kim et al. | 257/432 |

FOREIGN PATENT DOCUMENTS

| | | |
|---|---|---|
| CN | 102290424 A | 12/2011 |
| EP | 2398054 A2 | 12/2011 |
| JP | 2009-182223 A | 8/2009 |
| JP | 2010-118538 A | 5/2010 |
| JP | 4599417 B2 | 12/2010 |
| JP | 2012-004443 A | 1/2012 |
| KR | 20110138159 A | 12/2011 |
| TW | 201210004 A | 3/2012 |

\* cited by examiner

*Primary Examiner* — Twyler Haskins
*Assistant Examiner* — Dwight C Tejano
(74) *Attorney, Agent, or Firm* — White & Case LLP

(57) ABSTRACT

A solid-state imaging device according to an embodiment is a solid-state imaging device in which a plurality of pixel regions are formed into a two-dimensional array isolating the pixel regions from each other by element isolation regions, including a plurality of microlenses, a plurality of color filters arranged below the plurality of microlenses, a plurality of photoelectrical conversion sections arranged below the plurality of color filters and a magnetic field generating section provided on the element isolation regions between the plurality of microlenses and the plurality of photoelectrical conversion sections.

20 Claims, 11 Drawing Sheets

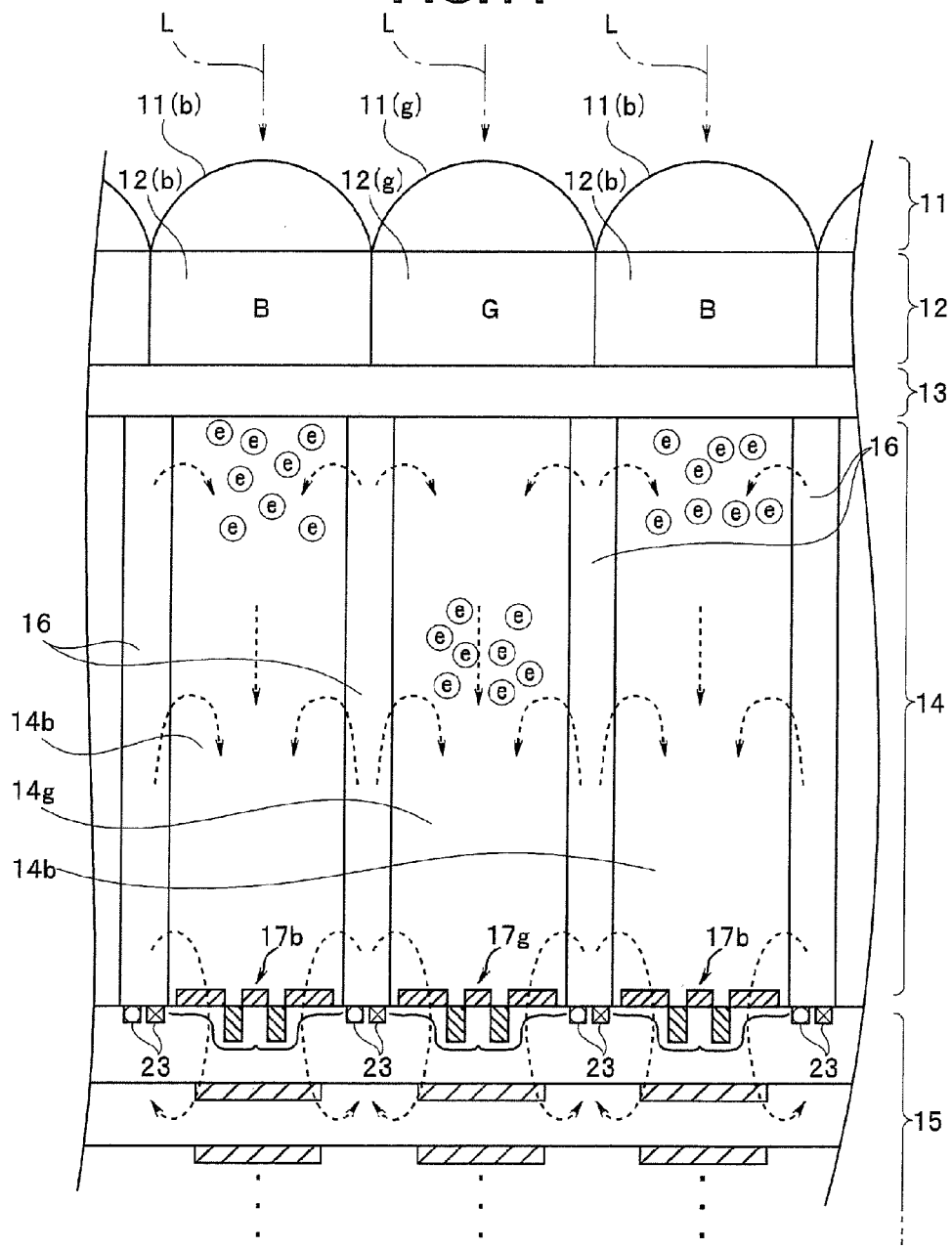

SOLID-STATE IMAGING APPARATUS

FIELD

The following embodiments relate to a solid-state imaging device.

BACKGROUND

Conventionally, solid-state imaging devices are widely used as image sensors. Image sensors are mounted on various apparatuses such as a camera apparatus, and in recent years, their pixel sizes are becoming smaller due to a tendency to increase the number of pixels of the solid-state imaging devices.

A solid-state imaging device includes a plurality of pixel regions arranged in a two-dimensional array and each pixel region is provided with a microlens that condenses light, a color filter that divides a color and a photodiode that performs photoelectrical conversion.

A pixel size reduction may result in an increased ratio between an incident distance and a condensing opening width of each pixel, that is, an increased aspect ratio, and may also result in an increased aspect ratio of a photodiode layer in each pixel region or the like, which is more likely to cause a problem of color mixing or the like.

BRIEF DESCRIPTION OF THE DRAWINGS

FIG. 14 is a schematic partial cross-sectional view of the solid-state imaging device 1A along a line XIV-XIV in FIG. 13.

DETAILED DESCRIPTION

Figure 1:
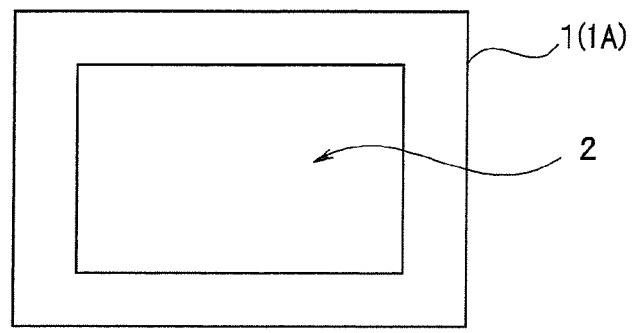
FIG. 1 is a schematic plan view of a solid-state imaging device for describing a configuration of a solid-state imaging device according to a first embodiment.

A solid-state imaging device according to an embodiment is a solid-state imaging device in which a plurality of pixel regions are formed into a two-dimensional array isolating the pixel regions from each other by element isolation regions, including a plurality of microlenses, a plurality of color filters arranged below the plurality of microlenses, a plurality of photoelectrical conversion sections arranged below the plurality of color filters, and a magnetic field generating section provided on the element isolation regions between the plurality of microlenses and the plurality of photoelectrical conversion sections.

A solid-state imaging device according to another embodiment is a solid-state imaging device in which a plurality of pixel regions are formed into a two-dimensional array isolating the pixel regions from each other by element isolation regions, including a plurality of microlenses, a plurality of color filters arranged below the plurality of microlenses, a plurality of photoelectrical conversion sections arranged below the plurality of color filters, and a magnetic field generating section provided below a layer in which the plurality of photoelectrical conversion sections are formed, and configured to generate a magnetic field so as to draw a charge photoelectrically converted by the photoelectrical conversion section toward a lower part of the layer.

Note that in each of drawings used for the following description, although the scale of each component is made to vary from one component to another in order to show each component in a size recognizable in the drawings, the present invention is not limited exclusively to the quantity of each component, the shape of each component, ratio in size between the components and relative positional relationships among the components described in the drawings.

First Embodiment (Configuration of Solid-State Imaging Device)

A solid-state imaging device of the present embodiment can reduce color mixing. Particularly, since the influence of color mixing increases as the aspect ratio of a pixel region increases, wiring and a magnet or the like of the solid-state imaging device which will be described below constitute effective color mixing suppressing means.

Figure 2:
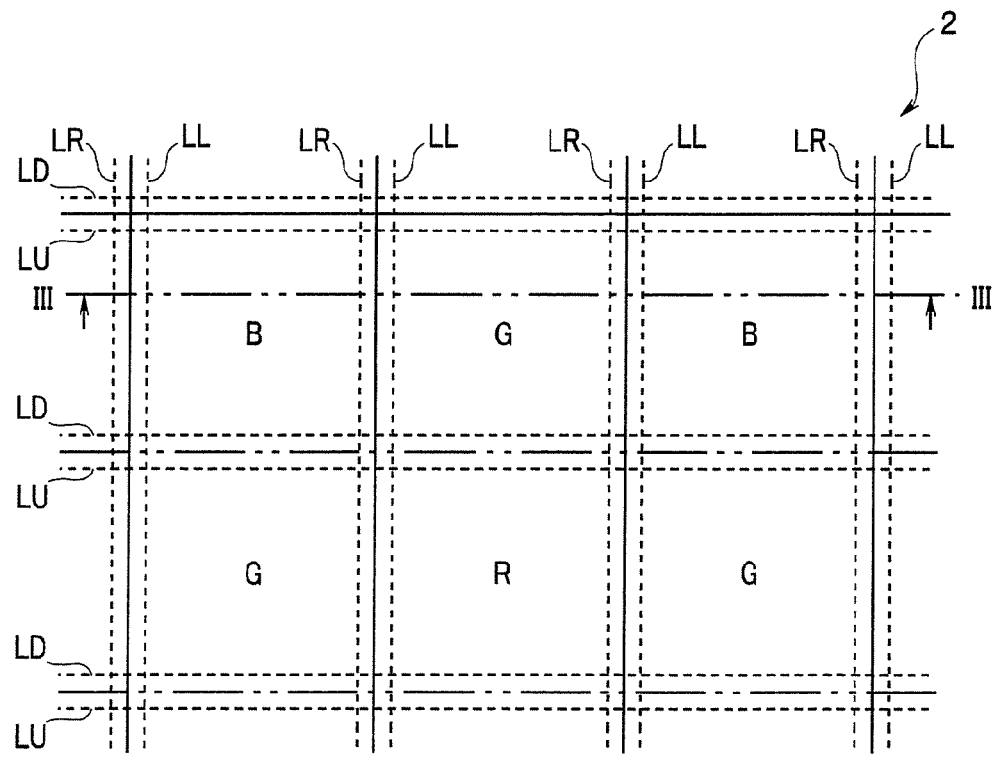
FIG. 2 is a diagram illustrating a pixel array on a light receiving surface of the solid-state imaging device according to the first embodiment in a plan view of a two-dimensional array.

FIG. 1 is a schematic plan view of the solid-state imaging device for describing a configuration of the solid-state imaging device. FIG. 2 is a diagram illustrating a pixel array on a light receiving surface of the solid-state imaging device in a plan view of a two-dimensional array. Note that here, the solid-state imaging device of the present embodiment will be described using an example of a back side illumination type solid-state imaging device.

As shown in FIG. 1 and FIG. 2, the solid-state imaging device 1 is an image sensor including an image pickup region 2 in which a plurality of pixel regions are formed into a two-dimensional array isolating the pixel regions from each other by element isolation regions on a silicon substrate (not shown). Here, an array of a plurality of pixels of RGB in the image pickup region 2 is, for example, a Bayer array.

As shown in FIG. 2, each pixel region of RGB has a substantially square shape, for example, and a plurality of wires are arranged in vertical and horizontal directions. In FIG. 2, a plurality of conductive wires LL and LR which extend in the vertical direction (hereinafter, also referred to as "Y direction") are aligned in the horizontal direction (hereinafter, also referred to as "X direction"). Similarly, a plurality of conductive wires LU and LD which extend in the X direction are aligned in the Y direction. In FIG. 2, the wires LL, LR, LU and LD are shown by dotted lines.

Figure 3:
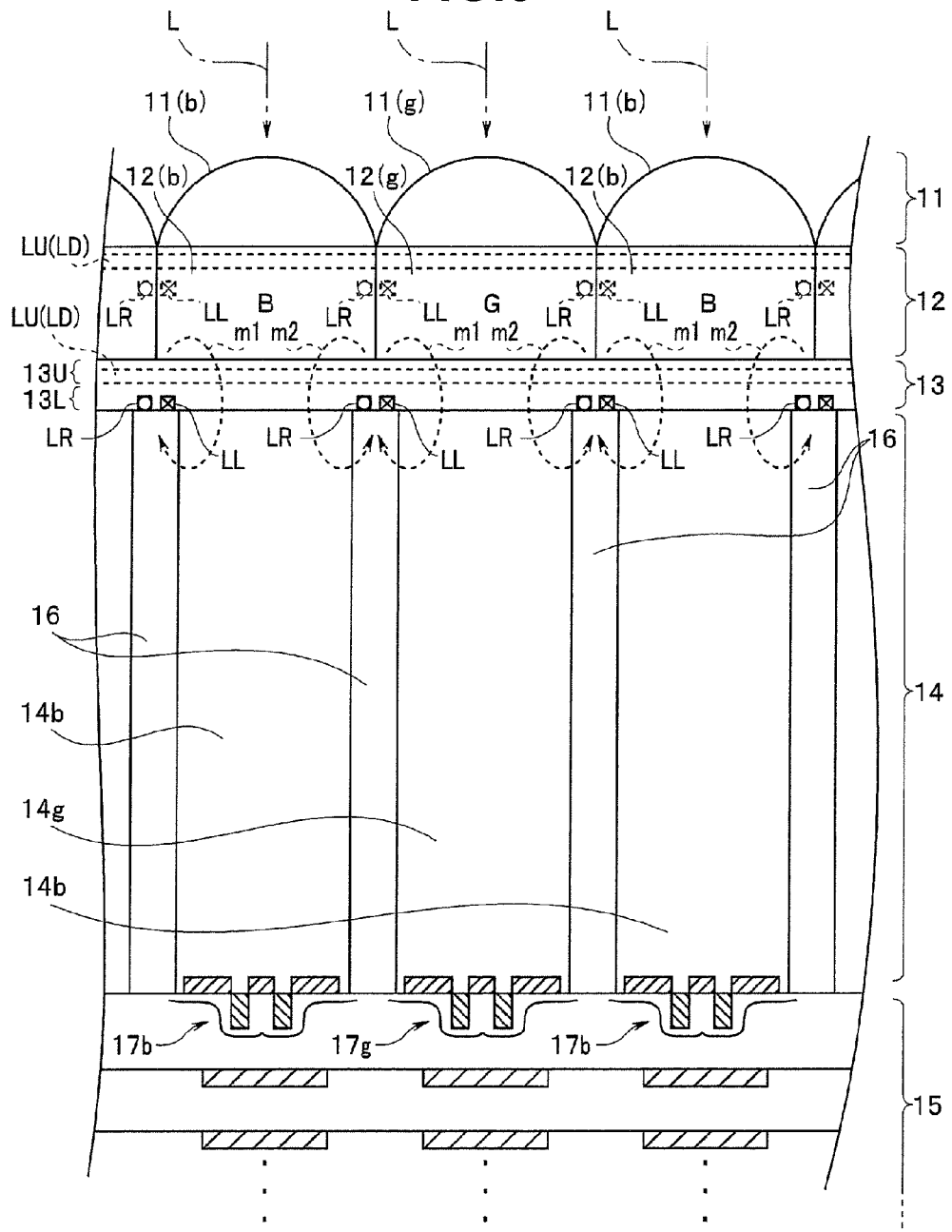
FIG. 3 is a schematic partial cross-sectional view of the solid-state imaging device 1 along a line III-III in FIG. 2.

FIG. 3 is a schematic partial cross-sectional view of the solid-state imaging device 1 along a line III-III in FIG. 2. FIG. 3 illustrates a cross section of three pixel regions of blue (B), green (G) and blue (B). In the back side illumination type solid-state imaging device 1, light from an object impinges on a surface opposite to one surface side of a semiconductor substrate on which a signal reading circuit is formed. In FIG. 3, light L from the object impinges on the microlenses of the solid-state imaging device 1 from above toward the surface of the sheet in FIG. 3.

The solid-state imaging device 1 includes a microlens layer 11 including a plurality of microlenses on which the light L from the object impinges toward the silicon substrate, a color filter layer 12 of three colors of RGB, an insulating film 13, a photodiode layer 14 and a multilayer wiring layer 15.

A microlens, a color filter and a photodiode corresponding to each pixel are provided in each pixel region. The plurality of color filters are arranged below the plurality of microlenses and the plurality of photodiodes are arranged below the plurality of color filters. That is, the plurality of photodiodes are arranged below the plurality of microlenses, and light that has passed through each corresponding microlens impinges on each photodiode which is the photoelectric conversion section. FIG. 3 shows that a microlens 11b, a color filter 12b and a photodiode region 14b are provided in a blue pixel region, and a microlens 11g, a color filter 12g and a photodiode region 14g are provided in a green pixel region. A microlens 11r, a color filter 12r and a photodiode region 14r are provided in a red pixel region (not shown).

An element isolation region 16 is provided between two neighboring photodiode regions. FIG. 3 shows that the element isolation region 16 is provided between the neighboring photodiode regions 14b and 14g.

A read transistor that reads a charge generated in each photodiode region is provided below the photodiode region of each pixel region. FIG. 3 shows that read transistors 17b and 17g are formed on the multilayer wiring layer 15 below the photodiode regions 14b and 14g respectively.

As shown in FIG. 2, in a plan view of the semiconductor substrate of the solid-state imaging device 1, a plurality of wires LL, LR, LU and LD are provided so as to sandwich a pixel center part of each pixel. The plurality of wires LL, LR, LU and LD may be provided in any locations between the microlens layer 11 and the photodiode layer 14. In the present embodiment, as shown in FIG. 3, the plurality of wires LL, LR, LU and LD are arranged in the insulating film 13 provided between the microlens layer 11 and the photodiode layer 14. That is, the plurality of pairs of wires LL, LR, and LU, LD are provided between the microlens layer 11 in which the plurality of microlenses are formed and the photodiode layer 14 in which the plurality of photodiodes are formed, and in the insulating film 13 between the two neighboring photodiode regions in a plan view of the two-dimensional array of the plurality of pixel regions. Particularly, the pairs of wires LL, LR, and LU, LD are provided on the element isolation regions 16 between the microlenses and the photodiodes which are the photoelectrical conversion sections.

As shown in FIG. 3, a plurality of pairs of wires LL and LR which extend in the Y direction are provided in a lower region 13L of the insulating film 13 and a plurality of pairs of wires LU and LD which extend in the X direction are provided in an upper region 13U of the insulating film 13. To be more specific, a plurality of pairs of wires LL and LR are provided so as to extend in the vertical direction of the two-dimensional array and a plurality of pairs of wires LU and LD (shown by dotted lines) are provided so as to extend in the horizontal direction of the two-dimensional array. The insulating film 13 includes a lower region 13L which is the layer in which a pair of wires LL and LR extending in the vertical direction are provided and an upper region 13U which is the layer in which a pair of wires LU and LD extending in the horizontal direction are provided. The respective wires LL, LR, LU and LD are provided on the element isolation regions 16 as shown in FIG. 3.

Thus, one wire LL and the other wire LR of a pair of wires LL and LR are provided so as to sandwich the pixel center part of each pixel region in a plan view of the two-dimensional array. Similarly, one wire LU and the other wire LD of a pair of wires LU and LD are provided so as to sandwich the pixel center part of each pixel region in a plan view of the two-dimensional array. That is, in each pixel region, a pair of wires LL and LR, and a pair of wires LU and LD are provided so as to sandwich the pixel center part of each pixel region.

A current flows through each of the wires LL and LR of the lower region 13L of the insulating film 13 in a predetermined direction. Currents flow through the pair of wires LL and LR in mutually opposite directions so as to generate a magnetic field directed from up (microlens side) to down (multilayer wiring layer side) in the pixel center part of each pixel. As shown in FIG. 3, a current flows through the wire LL so as to generate a magnetic field m1 shown by a dotted line and a current flows through the wire LR so as to generate a magnetic field m2 shown by a dotted line.

A current flows through each of the wires LU and LD of the upper region 13U of the insulating film 13 in a predetermined direction. Though not shown in FIG. 3, currents flow through the pair of wires LU and LD in mutually opposite directions so as to generate a magnetic field directed from up (microlens side) to down (multilayer wiring layer side) in the pixel center part of each pixel in order to draw photoelectrons from the microlenses to the photodiodes. The wires LL, LR, LU and LD constitute a magnetic field generating section.

Note that the wires LL, LR, LU and LD are provided in the insulating film 13 on the element isolation regions 16 here, and some of the respective wires LL, LR, LU and LD may overlap the photodiode 14 in a plan view of the pixel region 2. That is, at least some of the pair of wires may be provided so as to overlap the element isolation regions provided between the neighboring photodiode regions.

(Operation)

Light from an object impinges on the microlens layer 11, passes through the color filter layer 12 and the insulating film 13 and reaches the photodiode layer 14.

Especially when the aspect ratio of the photodiode region is high, when the light impinging on the microlens layer 11 enters in a diagonal direction with respect to the semiconductor substrate, a charge, which is photoelectrons, attempts to enter the neighboring pixel region. Furthermore, when the aspect ratio is high, each color filter of the color filter layer 12 may also be formed diagonally and have a tapered portion. However, since the charge is directed toward the pixel center part by the magnetic fields generated by the aforementioned wires LL, LR, LU and LD, color mixing by diagonally impinging light or the like is reduced.

In the aforementioned example, a plurality of pairs of wires LL and LR in the vertical direction aligned in the X direction and a plurality of pairs of wires LU and LD in the horizontal direction aligned in the Y direction are provided. However, a plurality of pairs of wires may be provided in only one of the vertical and horizontal directions.

For example, without the plurality of pairs of wires LU and LD which extend in the horizontal direction aligned in the Y direction, only the plurality of wires LL and LR which extend in the vertical direction aligned in the X direction may be provided. Alternatively, without the plurality of pairs of wires LL and LR which extend in the horizontal direction aligned in the X direction, only the plurality of wires LU and LD in the vertical direction aligned in the Y direction may be provided. Although the magnetic field that draws a charge into the pixel center part decreases, an effect of reducing color mixing can be obtained.

(Modification)

Note that magnets may be used instead of the above-described plurality of wires LL, LR, LU and LD.

Figure 4:
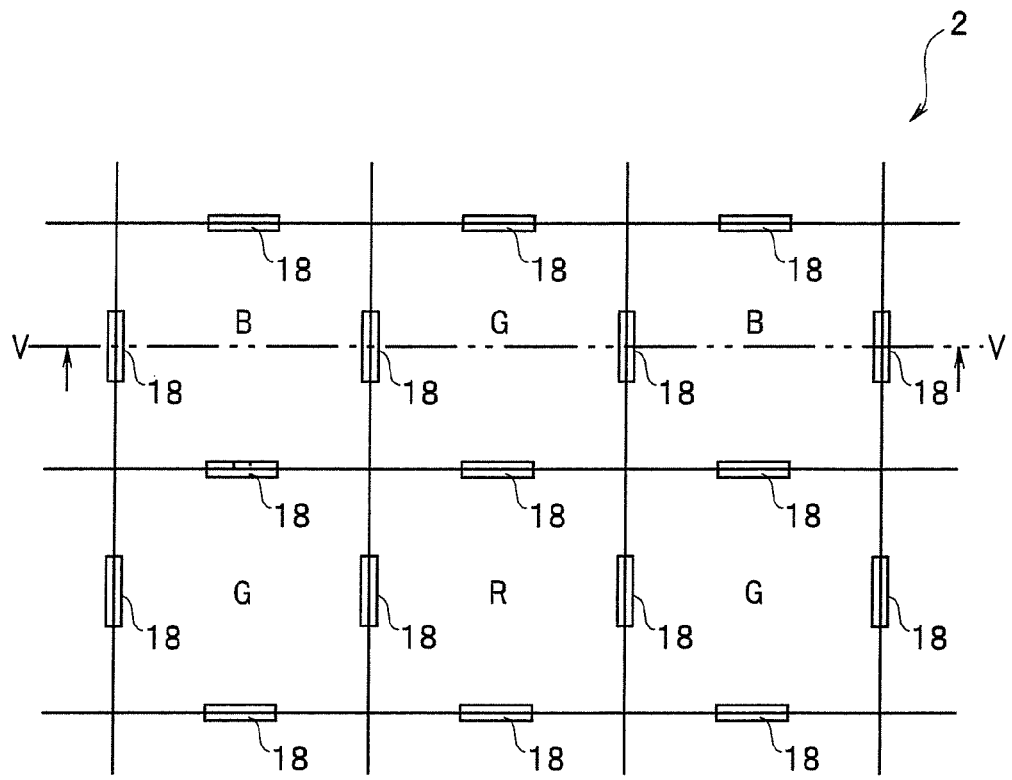
FIG. 4 is a diagram illustrating a pixel array and a magnet array on the light receiving surface of the solid-state imaging device 1 according to the first embodiment when a magnet is used.
Figure 5:
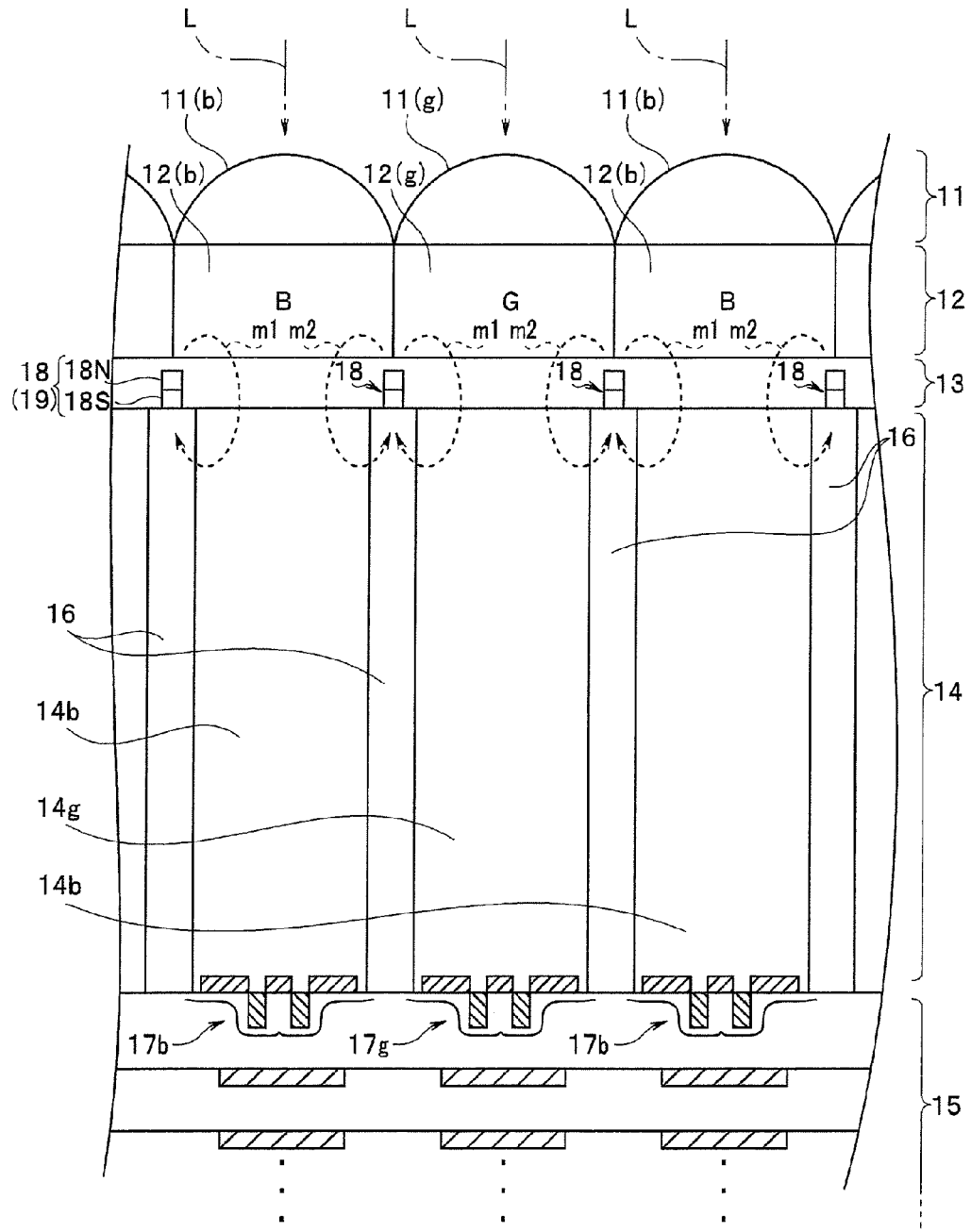
FIG. 5 is a schematic partial cross-sectional view of a solid-state imaging device 1A along a line V-V in FIG. 4.

FIG. 4 is a diagram illustrating a pixel array and a magnet array on a light receiving surface of the solid-state imaging device 1 when magnets are used instead of the plurality of wires shown in FIG. 2. FIG. 5 is a schematic partial cross-sectional view of a solid-state imaging device 1 along a line V-V in FIG. 4.

In a plan view of the two-dimensional array, four magnets 18 are arranged in the vertical and horizontal directions so as to sandwich the pixel center part in the center of each pixel region. As shown in FIG. 4, the plurality of magnets 18 are arranged into a two-dimensional array in the vertical and horizontal directions.

The plurality of magnets 18 are permanent magnets and provided on the insulating film 13 on the element isolation section 16. As shown in FIG. 5, each magnet 18 is provided such that each N-pole side 18N faces upward, which is the color filter layer 12 side and each S-pole side 18S faces downward, which is the photodiode layer 14 side.

Since the plurality of magnets 18 are arranged in such directions, magnetic fields are generated in directions shown by dotted lines in FIG. 5.

Figure 6:
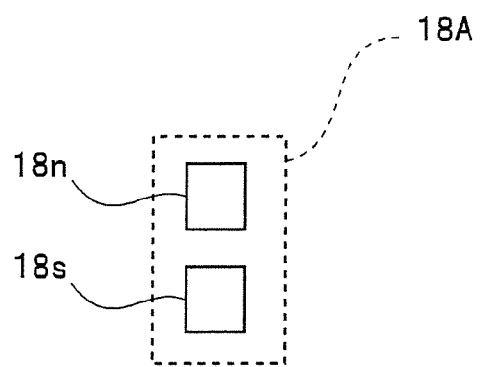
FIG. 6 is a diagram illustrating an example of a magnet 18A configured of a mono-pole magnet 18n made up of only an N pole and a mono-pole magnet 18s made up of only an S pole according to the first embodiment.

Note that a mono-pole magnet may also be used for each magnet 18. FIG. 6 is a diagram illustrating an example of a magnet 18A configured of a mono-pole magnet 18n made up of only an N pole and a mono-pole magnet 18s made up of only an S pole. The magnet 18A shown in FIG. 6 may be arranged instead of the magnet 18.

In FIG. 6, each magnet 18A is provided such that the N-pole side 18n is located on the color filter layer 12 side and the S-pole side 18s is located on the photodiode layer 14 side. The four magnets 18A are also provided at the same positions as the four magnets 18 as shown in FIG. 4 so as to sandwich the pixel center part in a plan view of the two-dimensional array, and provided below the color filter layer 12 so as to generate a magnetic field in the direction shown by a dotted line in FIG. 5. That is, in a plan view of the two-dimensional array, a pair of magnets 18 or 18A provided so as to sandwich the pixel center part in each pixel region constitute a magnetic field generating section.

Furthermore, bar magnets may also be used for the aforementioned magnets.

Figure 7:
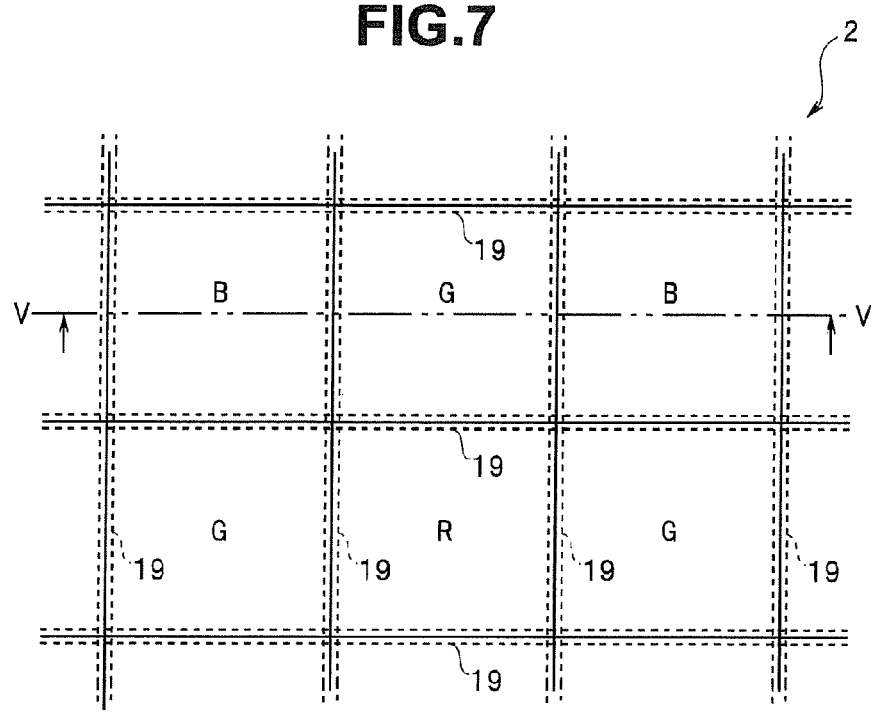
FIG. 7 is a diagram illustrating a pixel array and a bar magnet array on the light receiving surface of the solid-state imaging device 1 according to the first embodiment when a bar magnet is used as a magnetic field generating section.

FIG. 7 is a diagram illustrating a pixel array and a bar magnet array on the light receiving surface of the solid-state imaging device 1 when a bar magnet is used as a magnetic field generating section.

When a plurality of bar magnets are used as a magnetic field generating section, a plurality of bar magnets 19 are provided aligned in the vertical and horizontal directions. In each pixel region, the plurality of bar magnets 19 are provided such that the pixel center part is sandwiched by two bar magnets 19. A schematic partial cross-sectional view of the solid-state imaging device 1 along a line V-V in FIG. 7 is the same as that in FIG. 5.

Note that the plurality of bar magnets which extend in the vertical direction and the plurality of bar magnets which extend in the horizontal direction are arranged on different layers of the insulating film 13.

Figure 8:
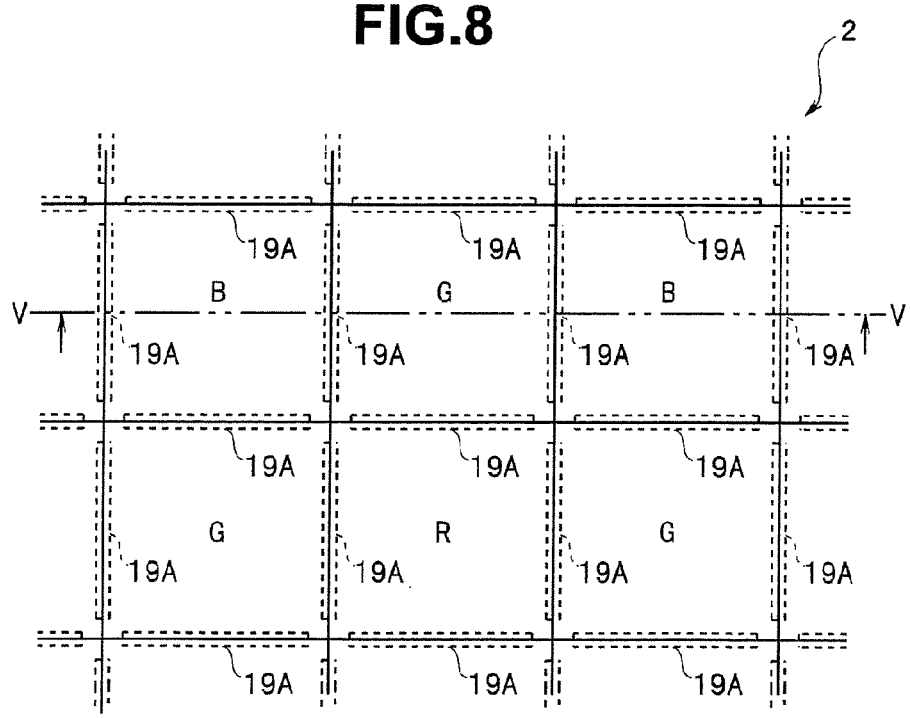
FIG. 8 is a diagram illustrating a pixel array and a bar magnet array on the light receiving surface of the solid-state imaging device 1 according to the first embodiment when a plurality of bar magnets are used as a magnetic field generating section and when the plurality of divided bar magnets 19A are aligned in vertical and horizontal directions.

Moreover, bar magnets may be divided and arranged in an array. FIG. 8 is a diagram illustrating a pixel array and a bar magnet array on the light receiving surface of the solid-state imaging device 1 when a plurality of bar magnets are used as a magnetic field generating section and when the plurality of divided bar magnets 19A are aligned in the vertical and horizontal directions. In such a configuration, the plurality of bar magnets 19A which extend in the vertical direction can be arranged on the same layer of the insulating film 13. This eliminates the necessity for providing a plurality of layers of the insulating film 13 and can thereby simplify manufacturing steps.

In the aforementioned embodiment, the wires LL, LR, LU and LD are provided within the insulating film 13, but the wires LL, LR, LU and LD may also be provided on the color filter layer 12 as shown by a dotted line in FIG. 3. Similarly, each magnet 18, 18A and each bar magnet 19, 19A in the aforementioned modification may also be provided on the color filter layer 12.

Second Embodiment

A solid-state imaging device according to the present embodiment can reduce a possibility that an increase in the aspect ratio of the photodiode region may cause the amount of charge read from the photodiode to differ from one color to another.

Hereinafter, the solid-state imaging device of the present embodiment will be described. The same components as those of the solid-state imaging device 1 of the first embodiment are assigned the same reference numerals and description thereof will be omitted. A plan view of a solid-state imaging device 1A of the present embodiment is the same as that in FIG. 1 of the first embodiment. The solid-state imaging device of the present embodiment will also be described using an example of a back side illumination type solid-state imaging device here.

Figure 9:
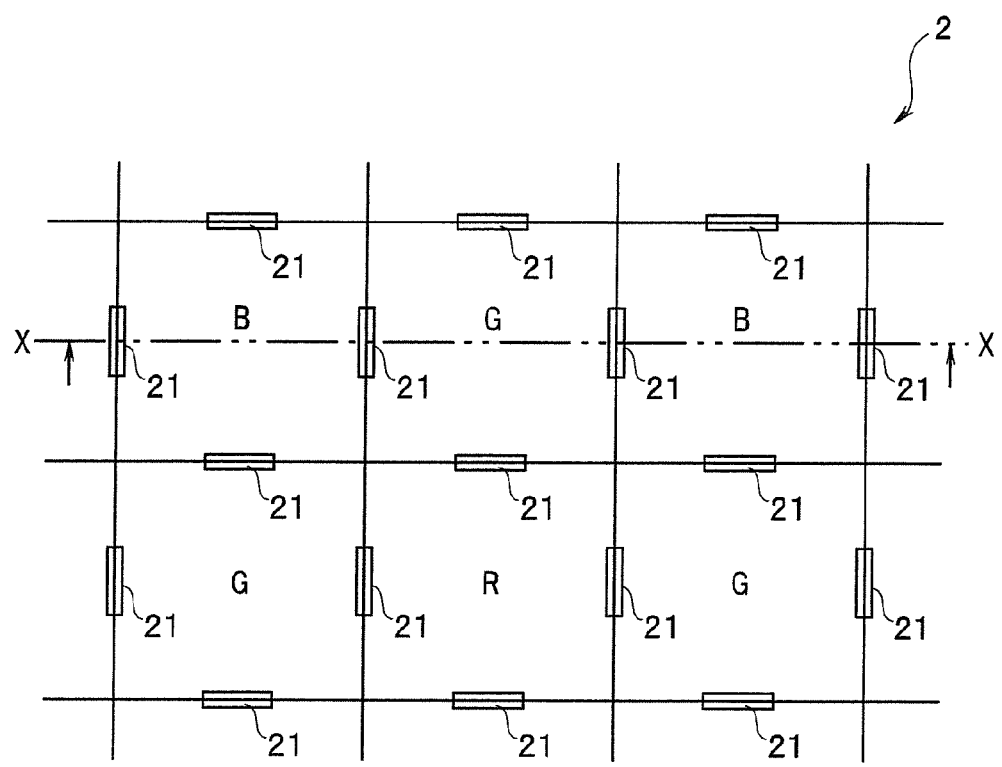
FIG. 9 is a diagram illustrating a pixel array and a magnet array on the light receiving surface of a solid-state imaging device 1A according to a second embodiment.
Figure 10:
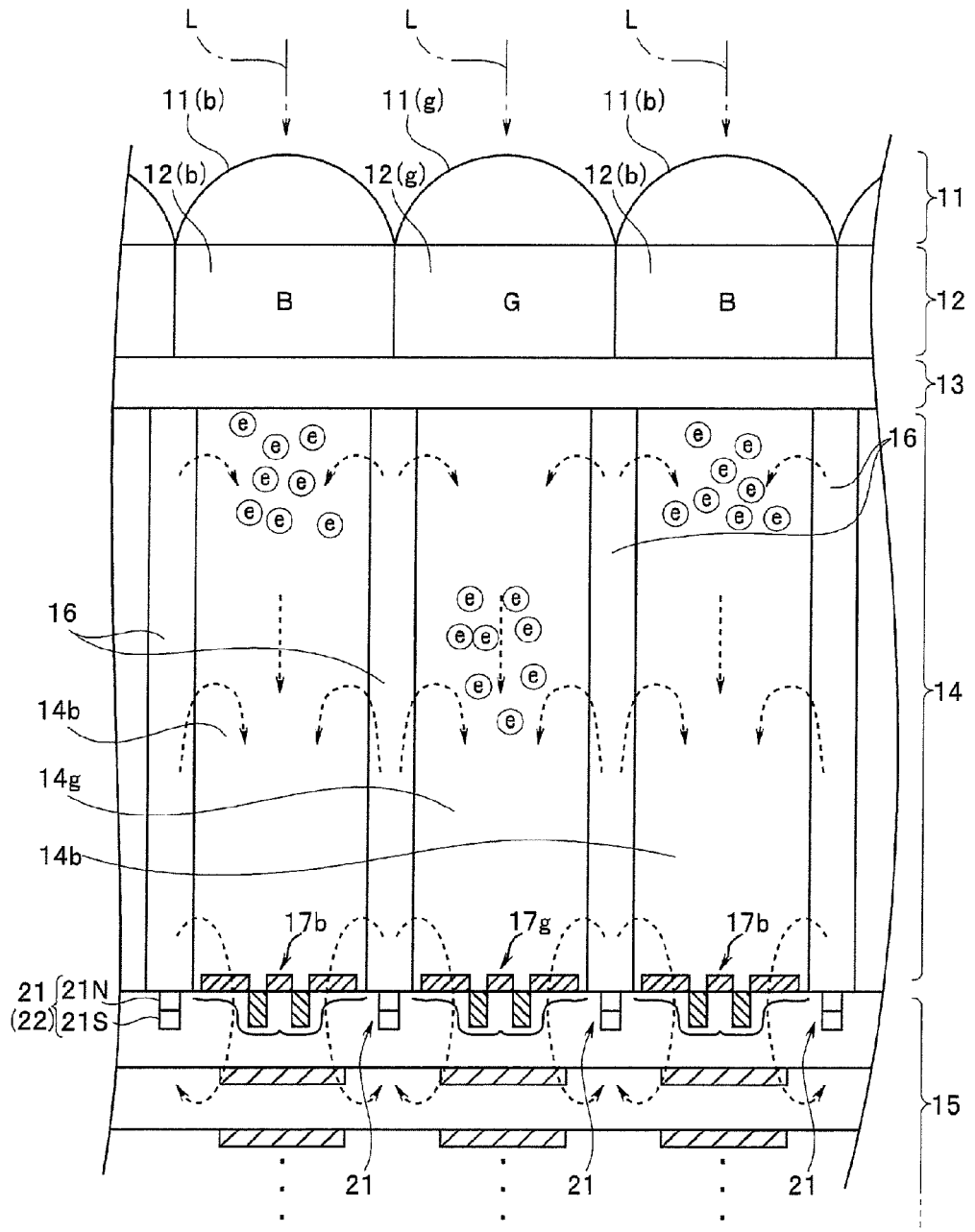
FIG. 10 is a schematic partial cross-sectional view of the solid-state imaging device 1A along a line X-X in FIG. 9.

FIG. 9 is a diagram illustrating a pixel array and a magnet array on the light receiving surface of the solid-state imaging device 1A according to the present embodiment. FIG. 10 is a schematic partial cross-sectional view of the solid-state imaging device 1A along a line X-X in FIG. 9. The array of a plurality of pixels of RGB in the image pickup region 2 of the solid-state imaging device 1A is also, for example, a Bayer array.

Each pixel region has a substantially square shape, for example, and four magnets 21 are arranged in the vertical and horizontal directions so as to sandwich each pixel region in a plan view of the two-dimensional array. As shown in FIG. 9, a plurality of magnets 21 are arranged aligned in a two-dimensional array in the vertical and horizontal directions.

The plurality of magnets 21 are permanent magnets and provided in the multilayer wiring layer 15 below the element isolation regions 16. As shown in FIG. 10, each magnet 21 is provided such that each N-pole side 21N faces upward, which is the photodiode layer 14 side and each S-pole side 21S faces downward, which is the silicon substrate (not shown) side.

Since the plurality of magnets 21 are arranged in such directions, magnetic fields are generated in directions shown by dotted lines in FIG. 10.

A read transistor for reading a charge of each photodiode region is provided below each photodiode and in the pixel center part in each pixel region in a plan view of the two-dimensional array.

Note that the mono-pole magnet shown in FIG. 6 may also be used for each magnet 21.

(Operation)

An increase in the aspect ratio of each pixel and an increase in the aspect ratio of the photodiode region may cause a problem that the amount of charge read from the read transistor for reading charge in the photodiode region differs from one color to another.

The penetration depths of light through a matter vary from one wavelength of light to another. For example, in the case of FIG. 10, of the light incident from the microlens layer 11 side, it is more difficult for blue light to reach the depth of a photodiode region 14$b$ than red or green light. As shown in FIG. 10, the charge accumulated in the photodiode region 14$b$ is accumulated more in the upper part of the photodiode region than the charge accumulated in a photodiode region 14$g$.

That is, while the charge corresponding to blue light is accumulated at a position away from a read transistor 17$b$ provided below the photodiode region 14$b$, the charge corresponding to green or red light reaches the depth of the photodiode region 14$g$ or the like and is accumulated near a read transistor 17$g$. Thus, the amount of charge read by the read transistor 17$b$ is smaller than that read by the read transistor 17$g$ or the like.

In order to prevent a difference in the amount of read charge from occurring due to a difference in color, the solid-state imaging device 1A of the present embodiment arranges the four magnets 21 so as to surround the pixel center part in a plan view of the solid-state imaging device 1A as described above and provides the four magnets 21 so as to draw the charge in each pixel toward a lower part of the photodiode region. That is, the plurality of magnets 21 are provided below the photodiode layer 14 in which a plurality of photodiode regions are formed to constitute a magnetic field generating section that generates a magnetic field so as to draw the charge generated after being photoelectrically converted in the photodiode region toward a lower part of the photodiode layer 14 in the pixel center part of each pixel region.

The charge generated by blue light and accumulated in the upper part of the photodiode region 14$b$ (that is, away from the read transistor 17$b$) is drawn toward a lower part of the photodiode region 14$b$ by the magnetic field of the magnet 21, and therefore it is possible to reduce the amount of charge read by the read transistor of the charge generated by blue light compared to the charge generated by green or red light.

Note that bar magnets or wires may also be used instead of the aforementioned plurality of magnets 21.

Figure 11:
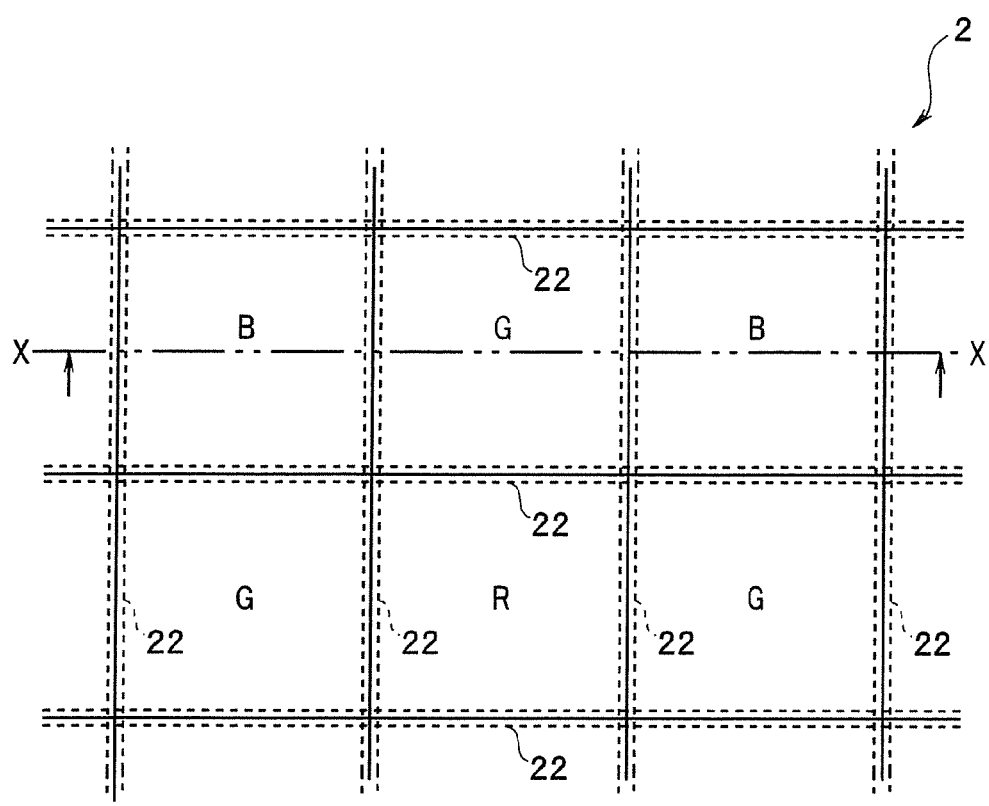
FIG. 11 is a diagram illustrating a pixel array and a bar magnet array on the light receiving surface of the solid-state imaging device 1A according to the second embodiment when a bar magnet is used as a magnetic field generating section.

FIG. 11 is a diagram illustrating a pixel array and a bar magnet array on the light receiving surface of the solid-state imaging device 1A when a bar magnet is used as a magnetic field generating section.

When a plurality of bar magnets are used as the magnetic field generating section, a plurality of bar magnets 22 are provided aligned in the vertical and horizontal directions. In each pixel region, the plurality of bar magnets 22 are provided such that each pixel center part is sandwiched by two bar magnets 22. A schematic partial cross-sectional view of the solid-state imaging device 1A along a line X-X in FIG. 11 is the same as that in FIG. 10.

Note that the plurality of bar magnets which extend in the vertical direction and the plurality of bar magnets which extend in the horizontal direction are arranged at different positions in the depth direction of the silicon substrate.

Figure 12:
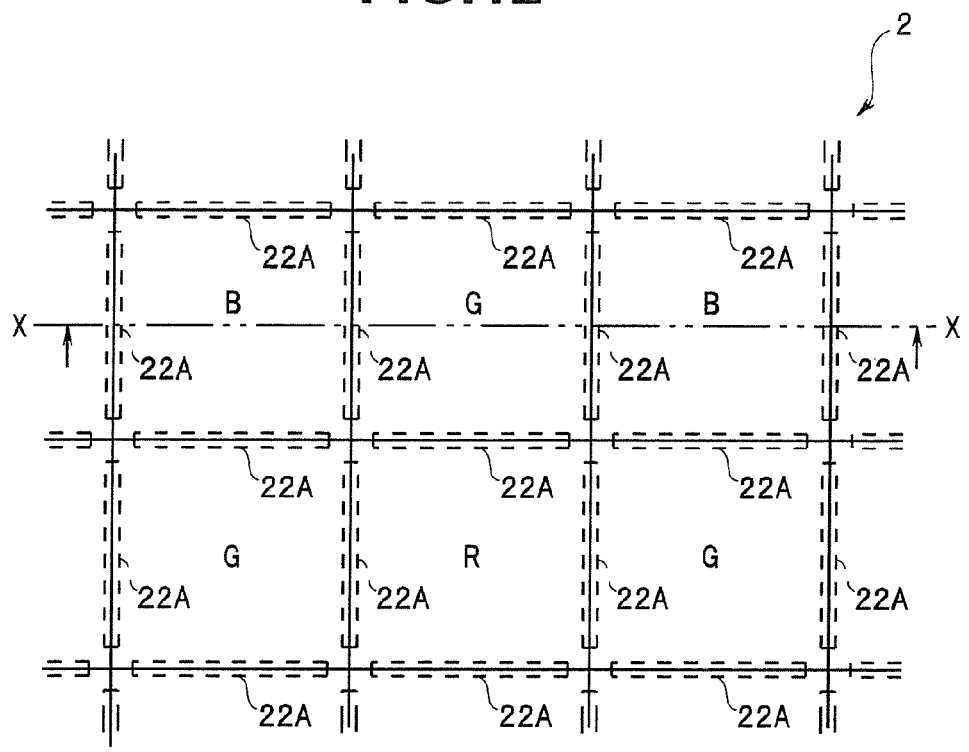
FIG. 12 is a diagram illustrating a pixel array and a bar magnet array on the light receiving surface of the solid-state imaging device 1A according to the second embodiment when a plurality of bar magnets are used as a magnetic field generating section and when the plurality of divided bar magnets 19A are aligned in vertical and horizontal directions.

Moreover, bar magnets may be divided and arranged in an array. FIG. 12 is a diagram illustrating a pixel array and a bar magnet array on the light receiving surface of the solid-state imaging device 1A in a case where a plurality of bar magnets are used as a magnetic field generating section and the plurality of divided bar magnets 19A are arranged aligned in the vertical and horizontal directions. In such a configuration, the plurality of bar magnets 19A which extend in the vertical direction need not be arranged at different positions in the depth direction of the silicon substrate.

Figure 13:
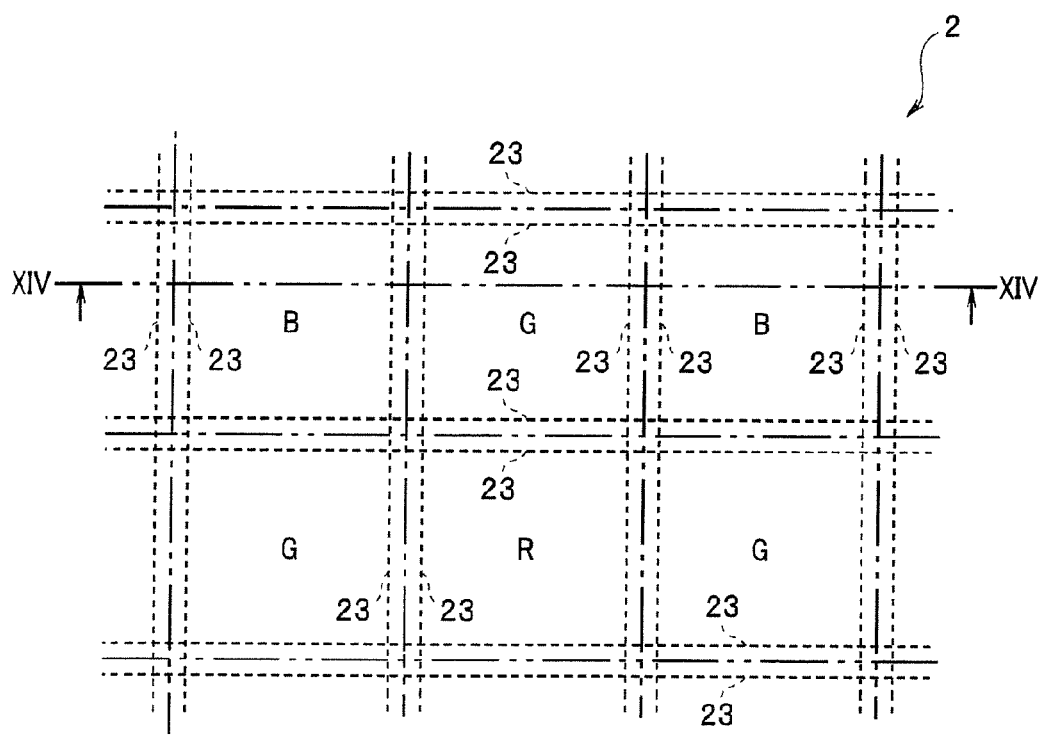
FIG. 13 is a diagram illustrating a pixel array and a wiring array on the light receiving surface of the solid-state imaging device 1A according to the second embodiment when wiring is used as a magnetic field generating section.

FIG. 13 is a diagram illustrating a pixel array and a wiring array on the light receiving surface of the solid-state imaging device 1A when wiring is used as a magnetic field generating section. FIG. 14 is a schematic partial cross-sectional view of the solid-state imaging device 1A along a line XIV-XIV in FIG. 13.

When a plurality of wires are used as the magnetic field generating section, a plurality of pairs of wires 23 are provided aligned in the vertical and horizontal directions. In each pixel region, a plurality of wires 23 are provided such that the pixel center part is sandwiched by four wires 23. Currents flow through the pair of wires 23 in mutually opposite directions. Currents flow through the pair of wires 23 only when the charge is read.

Note that the plurality of pairs of wires 23 which extend in the vertical direction and the plurality of pairs of wires 23 which extend in the horizontal direction are arranged in different layers of the insulating film 13.

Thus, in a plan view of the two-dimensional array, the plurality of pairs of wires 23 provided so as to sandwich the pixel center part in each pixel region constitute a magnetic field generating section.

As described above, it is also possible to generate a magnetic field that draws the charge toward a lower part of the photodiode region in each pixel region by using bar magnets or wiring.

Note that in the aforementioned example, in a plan view of the two-dimensional array, a plurality of magnetic field generating sections are provided in the vertical and horizontal directions so as to sandwich the pixel center part, but the plurality of magnetic field generating sections may be provided in only one of the vertical and horizontal directions.

For example, in the case of FIG. 9, in a plan view of the two-dimensional array, the plurality of magnets 21 may be provided in only one of the vertical and horizontal directions in each pixel region so as to sandwich the pixel center part. That is, the pair of magnets 21 may be provided in at least one of the vertical and horizontal directions so as to sandwich the pixel center part in each pixel region.

In the case of FIG. 11, the plurality of magnets 22 which extend in only one of the vertical and horizontal directions may be provided so as to sandwich the pixel center part. That is, a pair of bar magnets 22 may be provided in at least one of the vertical and horizontal directions so as to sandwich the pixel center part in each pixel region.

Furthermore, the magnet that generates a magnetic field is not limited to a bar magnet. A plurality of magnets may also be provided between neighboring pixels.

In the case of FIG. 13, the plurality of wires 23 which extend in only one of the vertical and horizontal directions may be provided so as to sandwich the pixel center part. That is, a plurality of pairs of wires 23 are provided so as to extend in at least one of the vertical and the horizontal direction of the two-dimensional array and one wire and the other wire of the pair of wires 23 are provided so as to sandwich the pixel center part in each pixel region.

Furthermore, the aforementioned magnetic field generating section may be provided only in the pixel center part of the pixel region of the blue filter of the color filter layer 12 provided below the microlens layer 11, only in the blue pixel region so as to draw photoelectrons toward a lower part of the photodiode layer 14.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A solid-state imaging device in which a plurality of pixel regions are formed into a two-dimensional array isolating the pixel regions from each other by element isolation regions, comprising:
   a plurality of microlenses;
   a plurality of color filters arranged below the plurality of microlenses;
   a plurality of photoelectrical conversion sections arranged below the plurality of color filters; and
   a magnetic field generating section provided on the element isolation regions between the plurality of microlenses and the plurality of photoelectrical conversion sections.

2. The solid-state imaging device according to claim 1, wherein the magnetic field generating section generates a magnetic field so as to draw photoelectrons from each microlens toward each photoelectrical conversion section.

3. The solid-state imaging device according to claim 1, wherein the magnetic field generating section is a pair of wires provided between two neighboring pixel regions.

4. The solid-state imaging device according to claim 3, further comprising an insulating film configured to include at least two layers provided between each color filter and each pixel region,
   wherein the pair of wires are formed in different layers of the insulating film.

5. The solid-state imaging device according to claim 4, wherein the pair of wires are provided in plurality so as to extend in vertical and horizontal directions between the plurality of pixel regions, and
   the insulating film comprises a first layer provided with a pair of wires which extend in the vertical direction and a second layer, which is different from the first layer, provided with a pair of wires which extend in the horizontal direction.

6. The solid-state imaging device according to claim 3, wherein the pair of wires are provided in plurality so as to extend in at least one of vertical and horizontal directions between the plurality of pixel regions, and
   one wire and the other wire of the pair of wires are provided so as to sandwich each pixel region in each of the pixel regions.

7. The solid-state imaging device according to claim 3, wherein currents flow through the pair of wires in mutually opposite directions.

8. The solid-state imaging device according to claim 3, wherein at least a part of the pair of wires are overlapped the pixel region in a plan view of the two-dimensional array.

9. The solid-state imaging device according to claim 1, wherein the magnetic field generating section is a pair of magnets provided between two neighboring photoelectrical conversion sections of the plurality of photoelectrical conversion sections.

10. The solid-state imaging device according to claim 9, wherein the pair of magnets is a pair of bar magnets.

11. The solid-state imaging device according to claim 1, wherein the plurality of photoelectrical conversion sections are photodiodes.

12. A solid-state imaging device in which a plurality of pixel regions are formed into a two-dimensional array isolating the pixel regions from each other by element isolation regions, comprising:
    a plurality of microlenses;
    a plurality of color filters arranged below the plurality of microlenses;
    a plurality of photoelectrical conversion sections arranged below the plurality of color filters; and
    a magnetic field generating section provided below a layer in which the plurality of photoelectrical conversion sections are formed, and configured to generate a magnetic field so as to draw a charge photoelectrically converted by the photoelectrical conversion sections toward a lower part of the layer.

13. The solid-state imaging device according to claim 12, wherein the magnetic field generating section is a pair of magnets provided below the element isolation region.

14. The solid-state imaging device according to claim 13, wherein the pair of magnets are provided in plurality in at least one of vertical and horizontal directions so as to sandwich the pixel region.

15. The solid-state imaging device according to claim 13, wherein the pair of magnets are a pair of bar magnets.

16. The solid-state imaging device according to claim 15, wherein the pair of bar magnets are provided in plurality in at least one of vertical and horizontal directions so as to sandwich the pixel region.

17. The solid-state imaging device according to claim 12, wherein the magnetic field generating section is a pair of wires provided so as to sandwich the pixel region.

18. The solid-state imaging device according to claim 17, wherein the pair of wires are provided in plurality so as to extend in at least one of vertical and horizontal directions between the plurality of pixel regions, and
    one wire and the other wire of the pair of wires are provided so as to sandwich the pixel region.

19. The solid-state imaging device according to claim 17, wherein currents flow through the pair of wires in mutually opposite directions.

20. The solid-state imaging device according to claim 12, wherein the plurality of photoelectrical conversion sections are photodiodes.

* * * * *